(12) United States Patent
Sherwood

(10) Patent No.: US 8,969,796 B2
(45) Date of Patent: *Mar. 3, 2015

(54) TIMING DEVICE AND METHOD

(71) Applicant: Kratos Analytical Limited, Manchester (GB)

(72) Inventor: Ian Sherwood, Northwich (GB)

(73) Assignee: Kratos Analytical Limited, Manchester (GB)

(*) Notice: Subject to any disclaimer, the term of this patent is extended or adjusted under 35 U.S.C. 154(b) by 0 days.

This patent is subject to a terminal disclaimer.

(21) Appl. No.: 14/205,444

(22) Filed: Mar. 12, 2014

(65) Prior Publication Data

US 2014/0191121 A1 Jul. 10, 2014

Related U.S. Application Data

(63) Continuation of application No. 13/883,589, filed as application No. PCT/GB2011/001557 on Nov. 3, 2011, now Pat. No. 8,716,674.

(30) Foreign Application Priority Data

Nov. 5, 2010 (GB) .................................. 1018758.1

(51) Int. Cl.
*H01J 49/02* (2006.01)
*H04L 7/00* (2006.01)
(Continued)

(52) U.S. Cl.
CPC ................ *H01J 49/022* (2013.01); *H04L 7/00* (2013.01); *H03M 9/00* (2013.01); *G06F 13/4295* (2013.01); *H01J 49/40* (2013.01); *H04L 7/033* (2013.01); *H03K 5/133* (2013.01)
USPC ........... 250/283; 250/281; 250/282; 250/286; 250/287; 250/423 P

(58) Field of Classification Search
CPC ................................ H01J 49/022; H01J 49/40
USPC ............. 250/281, 282, 283, 286, 287, 423 R, 250/423 P
See application file for complete search history.

(56) References Cited

U.S. PATENT DOCUMENTS 5,203,945 A 4/1993 Hasegawa et al.
6,953,928 B2 10/2005 Vestal et al.
(Continued)

FOREIGN PATENT DOCUMENTS

EP 1865538 A1 12/2007
JP 5-82069 A 4/1993
(Continued)

OTHER PUBLICATIONS

International Search Report and Written Opinion dated Sep. 12, 2013 corresponding to International Patent Application No. PCT/GB2011/001557. Submitted in U.S. Appl. No. 13/883,589.

*Primary Examiner* — Michael Logie
(74) *Attorney, Agent, or Firm* — Squire Patton Boggs (US) LLP

(57) ABSTRACT

The present invention provides a timing device, especially a timing device for use in mass spectrometers, for example TOF mass spectrometers, for processing trigger signal data containing a trigger signal indicating the occurrence of a trigger event, the timing device having: a trigger signal deserializer configured to receive trigger signal data containing a trigger signal indicating the occurrence of a trigger event as serial data and to output the trigger signal data as parallel data, and wherein suitably the timing device has a processing means configured to process trigger signal data outputted by the trigger signal deserializer as parallel data.

13 Claims, 7 Drawing Sheets

(51) Int. Cl.
   *H03M 9/00*    (2006.01)
   *G06F 13/42*   (2006.01)
   *H01J 49/40*   (2006.01)
   *H04L 7/033*       (2006.01)
   *H03K 5/13*        (2014.01)

(56) References Cited

U.S. PATENT DOCUMENTS

| | | |
|---|---|---|
| 7,084,393 B2 | 8/2006 | Fuhrer et al. |
| 7,109,480 B2 | 9/2006 | Vestal et al. |
| 7,936,854 B2 * | 5/2011 | Foley et al. ............... 375/354 |
| 8,135,104 B2 | 3/2012 | Kim et al. |
| 8,492,710 B2 | 7/2013 | Fuhrer et al. |
| 8,716,674 B2 * | 5/2014 | Sherwood ............... 250/423 P |
| 2004/0183009 A1 * | 9/2004 | Reilly et al. ............... 250/288 |
| 2005/0169647 A1 | 8/2005 | Haruyama |
| 2006/0139634 A1 | 6/2006 | Scott et al. |
| 2007/0063139 A1 | 3/2007 | Hall et al. |
| 2009/0008545 A1 * | 1/2009 | Fuhrer et al. ............... 250/287 |
| 2010/0231787 A1 | 9/2010 | Kim et al. |

FOREIGN PATENT DOCUMENTS

| | | |
|---|---|---|
| JP | 10-12175 A | 1/1998 |
| WO | 2004/051850 A2 | 6/2004 |
| WO | WO 2005/045419 A2 | 5/2005 |
| WO | 2009/014339 A2 | 1/2009 |

* cited by examiner

TIMING DEVICE AND METHOD

CROSS REFERENCE TO RELATED APPLICATION

This application is a Continuation of U.S. patent application Ser. No. 13/883,589 filed May 6, 2013 which is a 371 application of International Patent Application No. PCT/GB2011/001557 filed Nov. 3, 2011, and which claims priority from Great Britain Patent Application No. 1018758.1, dated Nov. 5, 2010. The contents of these applications are hereby incorporated by reference.

TECHNICAL FIELD

This invention generally relates to timing devices for processing trigger signal data containing a trigger signal indicating the occurrence of a trigger event. Preferably, this invention relates to such timing devices for use in mass spectrometers, e.g. TOF mass spectrometers, in which case the trigger event may, for example, be the firing of a laser for ionising sample material.

BACKGROUND

TOF mass spectrometry is an analytical technique for measuring the mass/charge ratio of ions by accelerating ions and measuring their time of flight to an ion detector.

In a simple form, a TOF mass spectrometer includes an ion source for generating a pulse (or burst) of ions of sample material and an ion detector for detecting ions that have travelled from the ion source to the ion detector. The ions generated by the ion source preferably have, e.g. because they have been accelerated to, a predetermined kinetic energy and so have different speeds according to their mass/charge ratio. Accordingly, as ions travel between the ion source and the ion detector, ions of different mass/charge ratios are separated by their different speeds and so are detected by the ion detector at different times, which allows their respective times of flight to be measured based on an output of the ion detector. In this way, mass spectrum data representative of the mass/charge ratio of ions of sample material can be acquired based on an output of the ion detector.

Matrix-assisted laser desorption/ionization, often referred to as "MALDI", is an ionisation technique in which, generally, a laser is used to fire light at a (usually crystalised) mixture of sample material and light absorbing matrix so as to ionise the sample material. The sample materials used with MALDI typically include molecules such as biomolecules (e.g. proteins), large organic molecules and/or polymers. The light absorbing matrix is generally used to protect such molecules from being damaged or destroyed by light from the laser. The resulting ions, which typically have masses of several thousand Daltons, are then accelerated to high kinetic energies, typically around 20 keV. Generally, an ion source configured to generate ions by MALDI is referred to as a "MALDI ion source". A MALDI ion source typically includes a laser for ionising sample material by firing light at a mixture of the sample material and light absorbing matrix.

MALDI is usually combined with time of flight mass spectrometry to provide "MALDI TOF" mass spectrometry in which, generally, a pulse of ions is generated by MALDI and the time of flight of the ions is then measured over distances typically of around 1-2 meters so that the mass/charge ratio of the ions can be determined.

Measuring the time of flight of ions in modern TOF mass spectrometers, e.g. MALDI TOF mass spectrometers, typically requires a diverse range of high speed digital and analogue electronics. For example, high speed timing electronics may be used in order to accurately synchronise various high-voltage electrical pulses with the firing of a laser and the acquisition of an ion signal. Also, kV/μs slew-rate high voltage electrical pulses may be used to accelerate, gate and steer ionised molecules generated by the laser. Finally, high speed multi-bit analogue to digital converters may be used to record the output from an ion detector so that the time of flight of the ions, and therefore the mass/charge ratio of the ions, can be determined. Such high speed digital and analogue electronics are typically run for each acquisition cycle of the TOF mass spectrometer.

Until recently, TOF mass spectrometers, e.g. MALDI TOF mass spectrometers, have used gas lasers having a repetition rate (rate at which it can fire pulses of light) of up to a few tens of Hz. More recent TOF mass spectrometers have used solid-state lasers capable of much higher repetition rates, e.g. 1 kHz or more.

The present inventors have found that high repetition rates of solid state lasers, combined with increasing clock speeds of digital electronics, has introduced new problems in the design of TOF mass spectrometers, particularly MALDI TOF mass spectrometers. These design problems include:

how to generate control data for controlling one or more components of a mass spectrometer with multiple high-precision delays (e.g. with microsecond durations and sub-nanosecond resolution);

how to stabilise power supplies to the electronics without radiating a lot of narrow-band electrical noise, especially for high-voltage pulses; and how to reduce the manifestation of noise in mass spectrum data produced by such MALDI TOF mass spectrometers.

A mass spectrometer preferably includes timing electronics for producing one or more control signals for controlling the operation of one or more components of the mass spectrometer such that the control signals are synchronised to a trigger event indicated by a trigger signal and/or for adjusting data produced by an analogue to digital converter of the mass spectrometer such that the adjusted data is synchronised to a trigger event indicated by a trigger signal. The trigger event may, for example, be the firing of a laser for ionising sample material.

Previously, the present inventors have used high speed positive-emitter-coupled logic (PECL) circuitry in the timing electronics of mass spectrometers. In such timing electronics, many separate PECL integrated circuits were used together to produce control signals synchronised to a trigger event indicated by trigger signal. These PECL integrated circuits were typically controlled by an FPGA integrated circuit, which could also be used to control other functionality of a transient recorder of the mass spectrometer.

Presently available PECL circuitry is capable of running at clock speeds of around 500 MHz. Consequently, the time resolution of such PECL circuitry is around 2 ns. However, there are several disadvantages associated with using PECL circuitry for the timing electronics of a mass spectrometer. Firstly, modern mass spectrometers may require digitisation speeds of many GHz, with timing electronics having a time resolution of less than a nanosecond. Such speeds and time resolution are difficult, if not impossible, to achieve with presently available PECL circuitry. Secondly, the complexity of the PECL circuitry involves many individual components, and so is difficult to implement for many separate PECL integrated circuits. This can add to the cost of the timing electronics of a mass spectrometer and mean that a large amount of printed circuit board real estate is required. Thirdly, as the PECL circuitry can be large and complex, the PECL circuitry may be unreliable, especially when manufacturing circuit boards. Finally, PECL circuitry cam be prone to disturbance by electrical noise and can also add to the EMC noise radiated by the circuit board.

SUMMARY OF THE INVENTION

The present invention has been devised in light of the above considerations.

In general, this invention relates to a trigger signal deserialiser which deserialises trigger signal data containing a trigger signal indicating the occurrence of a trigger event by receiving the trigger signal data as serial data and which outputs the trigger signal data as parallel data.

Each bit of the deserialised trigger signal data can be viewed as, in effect, representing a time bin having a duration equal to one clock period at the serial clock rate of the trigger signal deserialiser. However, this trigger signal data will be outputted as parallel data at the parallel clock rate of the trigger signal deserialiser, which, in general, will only be a fraction (typically 1/N, where N is the bit width of the parallel data produced by the trigger signal deserialiser) of the serial clock rate.

Accordingly, the trigger signal data can be processed with improved time resolution, without the need for fast processing circuitry. This is because the trigger signal data can be processed at the relatively slow parallel clock rate of the trigger signal deserialiser, even if each bit of the deserialised trigger signal represents a time bin having a duration equal to a clock period at the serial clock rate of the trigger signal deserialiser (which may be many times faster than the parallel clock rate).

A first aspect of the invention may provide a timing device for processing trigger signal data containing a trigger signal indicating the occurrence of a trigger event, the timing device having:

a trigger signal deserialiser configured to receive trigger signal data containing a trigger signal indicating the occurrence of a trigger event as serial data and to output the trigger signal data as parallel data.

Accordingly, the trigger signal data can be processed by the timing device with improved time resolution, without the need for fast processing circuitry. This is because the trigger signal data can be processed at the relatively slow parallel clock rate of the trigger signal deserialiser, even if each bit of the deserialised trigger signal represents a time bin having a duration equal to a clock period at the serial clock rate of the trigger signal deserialiser (which may be many times faster than the parallel clock rate).

Preferably, the timing device has a processing means configured to process trigger signal data outputted by the trigger signal deserialiser as parallel data.

Preferably, the processing means is configured to operate at the parallel clock rate of the trigger signal deserialiser.

The processing means may include, for example, processing electronics such as logic.

The processing of the trigger signal data outputted by the trigger signal deserialiser as parallel data, by the processing means, could, for example, include producing data based on trigger signal data outputted by the trigger signal deserialiser as parallel data, detecting a trigger signal contained in trigger signal data outputted by the trigger signal deserialiser as parallel data and/or adjusting additional data received by the timing device based on trigger signal data outputted by the trigger signal deserialiser.

Preferably, the processing means is configured to produce data based on trigger signal data outputted by the trigger signal deserialiser as parallel data. The synchronised data produced in this way may include control data and/or adjusted additional data, e.g. as discussed below in further detail.

Preferably, the processing means is configured to detect a trigger signal contained in trigger signal data outputted by the trigger signal deserialiser as parallel data.

More preferably, the processing means is configured to detect a trigger signal contained in trigger signal data outputted by the trigger signal deserialiser as parallel data, and to produce data based on the detected trigger signal, preferably such that the data produced by the processing means is synchronised to a trigger event indicated by the detected trigger signal. The synchronised data produced in this way may include control data and/or adjusted additional data, e.g. as discussed below in further detail.

In the context of this application, when data or a signal is described as being "synchronised to" a trigger event indicated by a trigger signal, it is preferably meant that the data or signal is time aligned with the trigger event, in the sense that that the content of the data or signal is made dependent on the time at which the trigger event indicated by the trigger signal occurred.

By producing data synchronised to a trigger event indicated by a trigger signal contained in trigger signal data that has been deserialised by the trigger signal deserialiser, the amount of jitter between the trigger event and the produced data can be minimised.

Preferably, the processing means is configured to produce control data for controlling the operation of one or more components (preferably one or more components external to the timing device) based on trigger signal data outputted by the trigger signal deserialiser as parallel data.

For example, the processing means may be configured to produce the control data based on trigger signal data outputted by the trigger signal deserialiser as parallel data, by re-outputting trigger signal data, e.g. as described below with reference to FIGS. 4a and 4b.

Preferably, the processing means is configured to detect a trigger signal contained in trigger signal data outputted by the trigger signal deserialiser as parallel data, and to produce control data based on the detected trigger signal, preferably such that the control data is synchronised to a trigger event indicated by the detected trigger signal.

For example, the processing means may be configured to produce control data based on a detected trigger signal such that the control data produced is synchronised to a trigger event indicated by the detected trigger signal, by outputting control data in the form of a digital waveform (i.e. a sequence of 0 and 1 bits), if it detects a trigger signal contained in trigger signal data outputted by the trigger signal deserialiser as parallel data, e.g. as described below with reference to FIG. 4c.

The digital waveform outputted by the processing means may be pre-determined, or produced "on the fly", e.g. as described below with reference to FIGS. 5a-c.

The processing means may be configured to insert a delay into the control data, e.g. if the processing means detects a trigger signal. Such a delay may be inserted e.g. by the processing means inserting one or more extra 0 bits into the control data.

The processing means may be configured to output the control data as parallel data, e.g. at the parallel clock rate of the trigger signal deserialiser. In this case, the timing device preferably has one or more output serialisers each configured to receive respective control data outputted by the processing means as parallel data and to output the respective control data as serial data, preferably at the serial clock rate of the trigger signal deserialiser.

In this way, control data can be produced and outputted as serial data by the timing device with high (i.e. fine) time resolution, even if the processing means operates at a relatively slow clock rate.

Preferably, the trigger signal deserialiser and the one or more output serialisers are configured to be clocked at the same clock rate by a common clock source, e.g. to reduce/prevent jitter between the trigger signal deserialiser and the one or more output serialisers.

The control data may be for controlling the operation of one or more components of a mass spectrometer.

The timing device may be included in an apparatus having one or more components, wherein the processing means is configured to produce control data for controlling the operation of the one or more components.

In some embodiments, control data outputted by one or more output serialisers as serial data may control the one or more components directly. In other embodiments, control data outputted by one or more output serialisers as serial data may control the one or more components indirectly, e.g. with the control data outputted by the one or more output serialisers as serial data being converted into one or more control signals for controlling the one or more components.

Accordingly, the apparatus may include converting means configured to convert control data outputted by one or more output serialisers as serial data into one or more control signals for controlling the one or more components. Preferably, the converting means is configured such that, if the control data outputted by the one or more output serialisers as serial data is synchronised to a trigger event indicated by a detected trigger signal, then the resulting one or more control signals are also synchronised to the trigger event indicated by the detected trigger signal.

The converting means may include, for example, any one or more of a buffer, an amplifier, a high voltage pulsing switch, for each of the one or more output serialisers.

In some embodiments, the converting means may be configured to convert control data outputted by one or more output serialisers as serial data, into one or more analogue control signals for controlling the one or more components. To achieve this, the converting means may include a low pass filter for each of the one or more output serialisers.

The apparatus may be a mass spectrometer, e.g. a TOF mass spectrometer. The one or more components of the mass spectrometer to be controlled by the control data may, for example, include any one or more of: an extraction plate, an ion lens, an ion blanking gate and a gas valve.

An extraction plate may be for providing a (preferably high voltage, preferably ±500V or greater, ±1 kV or greater) electric field for accelerating ions into the mass spectrometer, which may be a TOF mass spectrometer. Focussing of a TOF mass spectrometer is generally achieved by pulsing an extraction plate with a high voltage (e.g ±1 kV or greater) pulse, and the accuracy and timing of the pulse directly affects the mass resolution of the TOF mass spectrometer.

An ion lens may be for focussing ions, e.g. ions contained in a pulse of ions of sample material generated by an ion source. An example of an ion lens is an einzel lens.

An ion blanking gate may be for producing an electric field for deflecting ions, e.g. low mass ions which may be derived from a matrix, e.g. from an ion detector of the mass spectrometer, which may be a TOF mass spectrometer. Accurate timing of an electric field produced by an ion blanking gate is important, because this timing directly relates to the position of the blanking gate and the mass of the ions to be blanked.

An gas valve may be for controlling the introduction of gas into a cell or ion trap located in a flight path of the mass spectrometer, which may be a TOF mass spectrometer, e.g. so as to fragment or stabilise the structure of ions contained therein. Accurate timing of the introduction of gas by such gas valves is important, because it needs to coincide with ions entering the cell or ion trap.

Preferably, the processing means is configured to produce adjusted additional data by adjusting additional data received by the timing device, based on trigger signal data outputted by the trigger signal deserialiser as parallel data. In the context of this application, "additional data" preferably means data received by the timing device that is additional to the trigger signal data.

More preferably, the processing means is configured to detect a trigger signal contained in trigger signal data outputted by the trigger signal deserialiser as parallel data, and to produce adjusted additional data by adjusting additional data received by the timing device based on the detected trigger signal, preferably such that the adjusted additional data is synchronised to a trigger event indicated by the detected trigger signal.

By way of example, the processing means may be configured to produce adjusted additional data such that the adjusted additional data is synchronised to a trigger event indicated by a detected trigger signal, by discarding, where appropriate, a portion of additional data received by the timing device based on the detected trigger signal, e.g. as described below with reference to FIG. 8.

Preferably, the timing device is configured to receive additional data such that one sample of the additional data is received per bit of the trigger signal data, as this simplifies the synchronisation of the additional data to a trigger signal detected by the processing means.

The timing device may be configured to receive the additional data as serial data, e.g. at the serial clock rate of the trigger signal deserialiser, or as parallel data, e.g. at the parallel clock rate of the trigger signal deserialiser. If the timing device is configured to receive the additional data as serial data, the timing device may have an additional data deserialiser configured to receive additional data received by the timing device as serial data and to output the additional data as parallel data. In this case, the processing means may produce the adjusted additional data by adjusting the additional data after it has been outputted as parallel data by the additional data deserialiser.

Preferably, the timing device is included in an apparatus having an additional data source configured to output additional data, wherein the timing device is configured to receive additional data outputted by the additional data source.

Preferably, the trigger signal deserialiser and the additional data source are configured to be clocked by a common clock source, e.g. to reduce/prevent jitter between the trigger signal deserialiser and the additional data source.

The additional data source may be configured to output the additional data as serial data, e.g. at the serial clock rate of the trigger signal deserialiser, or as parallel data, e.g. at the parallel clock rate of the trigger signal deserialiser. If the additional data source is configured to output the additional data as serial data, then the timing device preferably includes an additional data deserialiser, as explained above.

The additional data source may include an analogue to digital converter, e.g. configured to output the additional data based on an (e.g. analogue) output of an ion detector of a mass spectrometer.

Preferably, the analogue to digital converter is configured to output additional data such that one sample of the additional data is outputted per bit of the trigger signal data, as this helps to simplify the synchronisation of the additional data to a trigger signal detected by the processing means.

The apparatus may be a mass spectrometer. For example, the additional data source may include an analogue to digital converter, e.g. configured to output additional data based on an (e.g. analogue) output of an ion detector of the mass spectrometer, preferably such that the additional data is representative of the output of the ion detector.

The trigger signal data received by the timing device may contain non-trigger data, i.e. data other than a trigger signal. The non-trigger data preferably indicates the non-occurrence of a trigger event. The non-trigger data may, for example, include non-trigger data which indicates that a trigger signal has not yet been produced and/or non-trigger data which indicates that a trigger signal has already been produced.

A trigger signal contained in the trigger signal data may a transition between a 0 bit and a 1 bit, e.g. a transition from a 0 bit to a 1 bit and/or a transition from a 1 bit to a 0 bit. However, the trigger signal data and/or the trigger signal may take other forms.

Preferably, the timing device is included in an apparatus having a trigger signal data source configured to output trigger signal data containing a trigger signal indicating the occurrence of a trigger event as serial data, wherein the trigger signal deserialiser of the timing device is configured to receive trigger signal data outputted by the trigger signal data source.

Preferably, the trigger signal data source is configured to include a trigger signal in the trigger signal data to indicate the occurrence of a trigger event within the apparatus each time the trigger event occurs.

The trigger signal data source may take a variety of forms, and need not produce the serial trigger signal data with reference to a clock. For example, the serial trigger signal data outputted by the trigger signal data source may be self-timed serial data or asynchronous serial data. An example of a trigger signal data source that does not need to produce trigger signal data with reference to a clock is the trigger signal data source including a photodiode and a comparator, described in more detail below.

Where the trigger signal data source does produce the trigger signal data with reference to a clock, the trigger signal source may be clocked by the same clock source as the trigger signal deserialiser, e.g. with a view to reducing jitter. However, the trigger signal data source does not necessarily need to be clocked by the same clock source as the trigger signal deserialiser.

The apparatus may be a mass spectrometer. For example, the trigger signal data source may be configured to include a trigger signal in the trigger signal data to indicate the occurrence of a trigger event within the mass spectrometer each time the trigger event occurs. The trigger event may, for example, be the firing of a laser for ionising sample material. The trigger signal may, for example, be derived from a photodiode for detecting a pulse of light fired by the laser.

Preferably, where the apparatus is a mass spectrometer, the trigger signal data source includes a photodiode and a comparator. Preferably, the photodiode is positioned to receive light fired by a laser for ionising sample material, and the comparator is configured to compare an output of the photodiode with a reference so that the comparator outputs a first voltage (which may represent a 1 bit) when the photodiode receives light fired by the laser and a second, different, voltage (which may represent a 0 bit) when the photodiode does not receive light fired by the laser. In this arrangement, the output of the comparator is trigger signal data outputted as serial data that has been produced asynchronously, i.e. without reference to a clock. Within this trigger signal data, a transition from the second voltage to the first voltage (which may represent a 0 bit to 1 bit transition) is a trigger signal indicating the occurrence of a trigger event within the mass spectrometer, this trigger event being the firing of a laser.

The comparator of the trigger signal data source may be configured to implement hysteresis, e.g. so as to help reduce the possibility of a trigger signal being falsely outputted by the comparator due to noise on the output of the photodiode.

In the context of this application, "serial data" can be viewed as data that is transmitted one bit at a time. As should be apparent from the above discussion, in the context of this application, serial data does not need to be produced with reference to a clock, and, for example, may be produced by a photodiode and comparator in the manner described above.

Preferably, the timing device has, or is connected to, a pre-trigger signal data source configured to output pre-trigger signal data, preferably containing a plurality of transitions between 0 and 1 bits (e.g. 10101010), as serial data to be received by the trigger signal deserialiser before the timing device receives trigger signal data containing a trigger signal. As described below with reference to FIG. 10, this approach helps to reduce time alignment errors within the trigger signal deserialiser.

For best effect, the pre-trigger signal data source is preferably configured to output the pre-trigger signal data as close as possible to the trigger event indicated by the trigger signal, preferably with a gap of no more than 100 microseconds, more preferably no more than 10 microseconds, more preferably no more than 1 microsecond between the pre-trigger signal and the trigger event.

The pre-trigger signal data source may, for example, include a serialiser.

Preferably, any aforementioned deserialiser and/or serialiser is a multi-gigabit transceiver (MGT)/gigabit transceiver block (GXB) or similar, i.e. a transceiver capable of deserialising and/or serialising data at a serial bit rate of 1 gigabit per second or more. Preferably, all aforementioned deserialisers and serialisers are MGTs, GXBs or similar. MGTs are well known for their use in the implementation of serial data transfer protocols such as 10G Ethernet, Aurora, Gigabit Ethernet, GPON, Infiniband, Serial ATA and Serial RapidIO.

In addition to being capable of serialisation and deserialisation, MGTs typically incorporate a number of features in order to help them operate at high serial bit rates. These may include any one or more of clock data recovery, encoding/decoding, error detection, data alignment, clock correction, channel bonding and electrical idle/out-of-band signalling. When an MGT is used in a device for detecting a trigger signal and/or in a device for producing trigger signal data, it may be advantageous to disable and/or correct for some or all of these features, as can be seen from the detailed discussion below.

Preferably, the timing device has a field programmable gate array (FPGA). Preferably, the processing means and the trigger signal deserialiser are included in the FPGA. Other components of the device may also be included in the FPGA.

Preferably, the timing device is for use in a mass spectrometer. However, it is thought that the timing device could equally be used in apparatuses other than mass spectrometers, e.g. other apparatuses where producing data which is synchronised to a trigger signal is important such as transient recorders, digital oscilloscopes, timer counters, pulse generators, pulse sequence generators, logic analysers and radio frequency digital to analogue converters (RF DACs).

A second aspect of the invention may provide an apparatus having:
an above described timing device; and
a trigger signal data source configured to output trigger signal data containing a trigger signal indicating the occurrence of a trigger event as serial data;
wherein the trigger signal deserialiser of the timing device is configured to receive trigger signal data outputted by the trigger signal data source.

The trigger signal data source may be as described above.

The apparatus may further have one or more components, wherein the processing means of the timing device is configured to produce control data for controlling the operation of the one or more components.

The apparatus may further have an additional data source, wherein the timing device is configured to receive additional data outputted by the additional data source. The additional data source may be as described in connection with the first aspect of the invention.

Preferably, the apparatus is a mass spectrometer. However, as explained above, the timing device could be used in apparatuses other than mass spectrometers.

A third aspect of the invention relates to a method corresponding to the above described devices and apparatuses in use.

Accordingly, a third aspect of the invention may provide a method including:
receiving, at a trigger signal deserialiser, trigger signal data containing a trigger signal indicating the occurrence of a trigger event as serial data and outputting, from the trigger signal deserialiser, the trigger signal data as parallel data.

The method may include any method step implementing or corresponding to any apparatus feature described in connection with any above aspect of the invention.

For example, the method may include processing, e.g. in a processing means, the trigger signal data outputted by the trigger signal deserialiser as parallel data.

As another example, the method may include producing data based on the trigger signal data outputted by the trigger signal deserialiser as parallel data.

As another example, the method may include detecting a trigger signal contained in the trigger signal data outputted by the trigger signal deserialiser as parallel data.

As another example, the method may include detecting a trigger signal contained in trigger signal data outputted by the trigger signal deserialiser as parallel data, and producing data based on the detected trigger signal such that the data produced is synchronised to a trigger event indicated by the detected trigger signal.

As another example, the method may include producing control data for controlling the operation of one or more components based on trigger signal data outputted by the trigger signal deserialiser as parallel data.

As another example, the method may include detecting a trigger signal contained in trigger signal data outputted by the trigger signal deserialiser as parallel data, and producing control data based on the detected trigger signal such that the control data is synchronised to a trigger event indicated by the detected trigger signal.

As another example, the method may include inserting a delay into the control data, e.g. if the processing means detects a trigger signal.

As another example, the method may include outputting, from a processing means, the control data as parallel data, receiving, at one or more output serialisers, the control data outputted by the processing means as parallel data, and outputting, from the one or more output serialisers, the control data as serial data.

As another example, the method may include the operation of one or more components of an apparatus being controlled by the control data.

As another example, the method may include converting control data outputted by one or more output serialisers as serial data into one or more control signals for controlling one or more components.

As another example, the method may include producing adjusted additional data by adjusting additional data, based on trigger signal data outputted by the trigger signal deserialiser as parallel data.

As another example, the method may include detecting a trigger signal contained in trigger signal data outputted by the trigger signal deserialiser as parallel data, and producing adjusted additional data by adjusting additional data based on the detected trigger signal such that the adjusted additional data is synchronised to a trigger event indicated by the detected trigger signal.

As another example, the method may include outputting, from an additional data source, the additional data.

As another example, the method may include outputting, from a trigger signal data source, the trigger signal data containing a trigger signal indicating the occurrence of a trigger event as serial data.

As another example, the method may include including a trigger signal in the trigger signal data to indicate the occurrence of a trigger event within an apparatus each time the trigger event occurs.

As another example, the method may include outputting pre-trigger signal data, preferably containing a plurality of transitions between 0 and 1 bits (e.g. 10101010), as serial data which is received by the trigger signal deserialiser before the trigger signal deserialiser receives trigger signal data containing a trigger signal.

A fourth aspect of the invention may provide a mass spectrometer including a field programmable gate array (FPGA), wherein the field programmable gate array includes at least one multi-gigabit transceiver (MGT) for serialising or deserialising data at a serial bit rate of over 1 gigabit per second.

Preferably, the FPGA is a timing device and the at least one MGT includes a trigger signal deserialiser configured to receive trigger signal data containing a trigger signal indicating the occurrence of a trigger event as serial data and to output the trigger signal data as parallel data, as described above.

Any aforementioned mass spectrometer may have an ion source for generating ions of sample material and an ion detector for detecting ions of sample material generated by the ion source.

The ion source may include a laser for ionising sample material by firing light at the sample material. Preferably, the laser is for ionising sample material by firing pulses of light at the sample material. The laser preferably produces UV light. Accordingly, an above described signal acquisition cycle may include the laser firing a pulse of light at the sample material to generate a pulse of ions of the sample material.

The ion source may be a MALDI ion source. For a MALDI ion source, the sample material may include biomolecules (e.g. proteins), organic molecules and/or polymers. The sample material may be included in a (preferably crystalised) mixture of sample material and light absorbing matrix. The light absorbing matrix may include DCTB (T-2-(3-(4-t-Butyl-phenyl)-2-methyl-2-propenylidene)malononitrile), DHB (2,5-dihydroxybenzoic acid), SA (sinapinic acid), DTL (1,8, 9-anthrecenetriol (dithranol)) or CHCA (α-Cyano-4-hydroxycinnamic acid), for example.

The ion source may include acceleration means for accelerating ions generated by the ion source to a predetermined kinetic energy. The acceleration means may include at least one acceleration electrode for producing an electric field to accelerate ions generated by the ion source to a predetermined kinetic energy. An above described method may include accelerating ions (e.g. generated by a laser for ionising sample material) to a predetermined kinetic energy using the acceleration means, e.g. to accelerate a pulse of ions generated by the ion source.

The ion source may include a sample holding means for holding sample material to be ionised by the ion source. The sample holding means may include a sample plate for holding sample material in one or more "sample spots". The sample holding means may include a sample plate carrier for carrying a sample plate. The sample plate is preferably configured to be removed from the ion source whereas the sample plate carrier may be non-removably mounted within the ion source.

The ion source preferably includes a housing, e.g. for containing the acceleration means and/or a sample holding means. The housing is preferably configured to be evacuated, i.e. configured to contain a vacuum.

Any aforementioned mass spectrometer may include one or more ion gates for selecting ions to be detected.

Any aforementioned mass spectrometer may include a reflectron. A reflectron is an ion mirror that, in use, reflects the ions in a pulse of ions back in the direction of an ion source to an ion detector, which may detect the ions after they have been reflected. One advantage of using a reflectron is that it generally produces higher mass resolution than using a linear ion detector (and therefore better mass accuracy), albeit with generally a lower maximum mass range.

Any aforementioned mass spectrometer may include a flight tube in which the ion source and ion detector are located. Other components, e.g. a reflectron may also be located in the flight tube. The flight tube is preferably evacuated when the mass spectrometer is in use.

Any aforementioned mass spectrometer may be a TOF mass spectrometer. Thus, for example, in each acquisition cycle, the ion source may generate a pulse of ions of sample material (e.g. by a laser firing a pulse of light at the sample material) such that ions of the sample material are detected by the ion detector. The TOF mass spectrometer may be a MALDI TOF mass spectrometer.

The invention also includes any combination of the aspects and preferred features described except where such a combination is clearly impermissible or expressly avoided.

BRIEF DESCRIPTION OF THE DRAWINGS

Embodiments of our proposals are discussed below, with reference to the accompanying drawings in which.

DESCRIPTION OF EMBODIMENTS AND EXPERIMENTS

Figure 1:
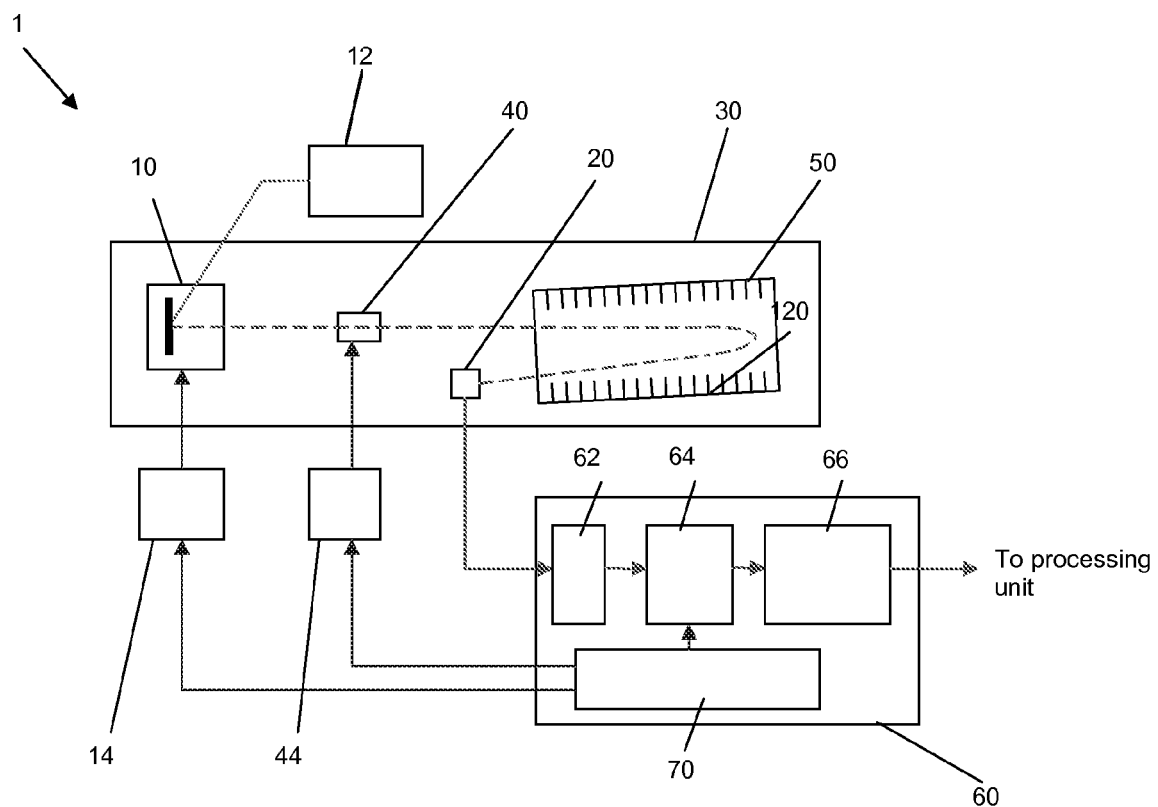
FIG. 1 is a schematic diagram showing a TOF mass spectrometer for use with the present invention.

FIG. 1 is a schematic diagram showing a TOF mass spectrometer 1 for use with the present invention.

The mass spectrometer 1 shown in FIG. 1 has an ion source 10 for generating a pulse of ions of sample material and an ion detector 20 for detecting ions of sample material generated by the ion source 10. The ion source 10 and ion detector 20 are located in an evacuated flight tube 30.

The ion source 10 includes a laser 12 for ionising sample material by firing pulses of (preferably UV) light at the sample material. In a MALDI TOF mass spectrometer, the sample material may be included in a crystalised mixture of the sample material and light absorbing matrix. The laser 12 fires a pulse of light when it is supplied with a high voltage pulse (typically ±1 kV or greater) from an associated high voltage supply 14. In a modern mass spectrometer, the laser 12 may be a solid state laser, capable of a high repetition rate, e.g. 1 kHz or more.

Because TOF mass spectrometry is a pulsed technique, in which individual pulses, rather than a continuous stream, of ions are produced, other components which in use are supplied with high voltage pulses may be located in the flight tube 30.

For example, an ion gate 40 for selecting ions to be detected by the ion detector 20 may be located in the flight tube 30. The ion gate 40 is able to select ions to be detected by the ion detector 20 by producing an electric field to deflect unwanted ions away from the direction of the ion detector 20, when it is supplied with a high voltage pulse (typically ±500V, although greater voltages can be used) from an associated high voltage supply 44. The ion gate may, for example, include interleaved wires. When the ion gate 40 is opened or closed, the high voltage supply 44 is typically switched at very high speed, preferably at time intervals of around 10 ns or less.

The mass spectrometer 1 may also include a reflectron 50. The reflectron 50 is an ion mirror that reflects the ions in an ion pulse back in the direction of the ion source 10 to be detected by the ion detector 20.

The mass spectrometer 1 also has electronics for producing mass spectrum data based on an output of the ion detector 20, which electronics is preferably located in a pre-processing unit 60 (or "transient recorder"). The electronics for producing mass spectrum data includes an analogue input section 62 for conditioning an output from the ion detector 20, an analogue to digital converter 64 for digitising the output from the ion detector 20 (as conditioned by the analogue input section 62) at very high speed (typically less than 1 ns between digitisation points), and a memory for storing signal mass spectrum data representative of the mass/charge ratio of ions of sample material before it is transferred to an external processing unit (not shown), such as a computer.

Preferably, the mass spectrometer has a trigger signal data source (not shown) configured to output trigger signal data containing a trigger signal indicating the occurrence of a trigger event (e.g. the firing of the laser 12) as serial data. Preferably, the trigger signal data source is configured to include a trigger signal in the trigger signal data to indicate the occurrence of a trigger event within the mass spectrometer each time the trigger event occurs.

Preferably, the trigger signal data source includes a photodiode and a comparator (not shown). Preferably, the photodiode is positioned to receive light fired by the laser 12, and the comparator is configured to compare an output of the photodiode with a reference so that the comparator outputs a first voltage (which represents a 1 bit) when the photodiode receives light fired by the laser and a second, different, voltage (which represents a 0 bit) when the photodiode does not receive light fired by the laser. In this arrangement, the output of the comparator is trigger signal data outputted as serial data that has been produced asynchronously, i.e. without reference to a clock. Within this trigger signal data, a transition from the second voltage to the first voltage (i.e. a 0 bit to 1 bit transition) is a trigger signal indicating the occurrence of a trigger event within the mass spectrometer, this trigger event being the firing of the laser 12.

Preferably, the pre-processing unit 60 includes timing electronics 70 configured to receive the trigger signal data outputted by the trigger signal data source.

Preferably, the timing electronics 70 is configured to produce one or more control signals for controlling the operation of one or more components of the mass spectrometer (e.g. via the high voltage power supplies 14, 44), preferably such that the control signals are synchronised to a trigger signal indicating the occurrence of a trigger event (e.g. as contained in trigger signal data outputted by the trigger signal data source). To produce such control signals, the timing electronics 70 may incorporate the timing device 100 shown in FIG. 3 and described in more detail below.

Preferably, the timing electronics 70 is also configured to produce adjusted additional data by adjusting additional data produced by the analogue to digital converter 64 of the mass spectrometer 1 and received by the timing electronics 70, based on a trigger signal indicating the occurrence of a trigger event (e.g. as contained in trigger signal data outputted by the trigger signal data source), preferably such that the adjusted additional data is synchronised to a trigger event indicated by the trigger signal. To produce such adjusted additional data, the timing electronics 70 may incorporate the timing device 200 shown in FIG. 7 and described in more detail below.

In use, the mass spectrometer 1 performs one or more signal acquisition cycles in which the ion source 10 is used to generate a pulse of ions of sample material such that ions of the sample material are subsequently detected by the ion detector 20. Preferably, the pulse of ions during each signal acquisition cycle is produced by the laser 12 firing a pulse of light at the sample material, with the ionised sample material being accelerated by acceleration electrodes (not shown) to a pre-determined kinetic energy. An output from the ion detector 20 is fed to the electronics for producing mass spectrum data in the pre-processing unit 60 which conditions and digitises the output and then stores, in the memory 66, mass spectrum data representative of the mass/charge ratio of ions of the sample material based on the conditioned and digitised output signal during the one or more signal acquisition cycles.

The mass spectrum data collected in one or more acquisition cycles may be plotted as a mass spectrum, showing amplitude against time of flight or mass/charge ratio, where the amplitude is representative of the number of ions that have been detected by the detector for a given time of flight or mass/charge ratio.

Figure 2:
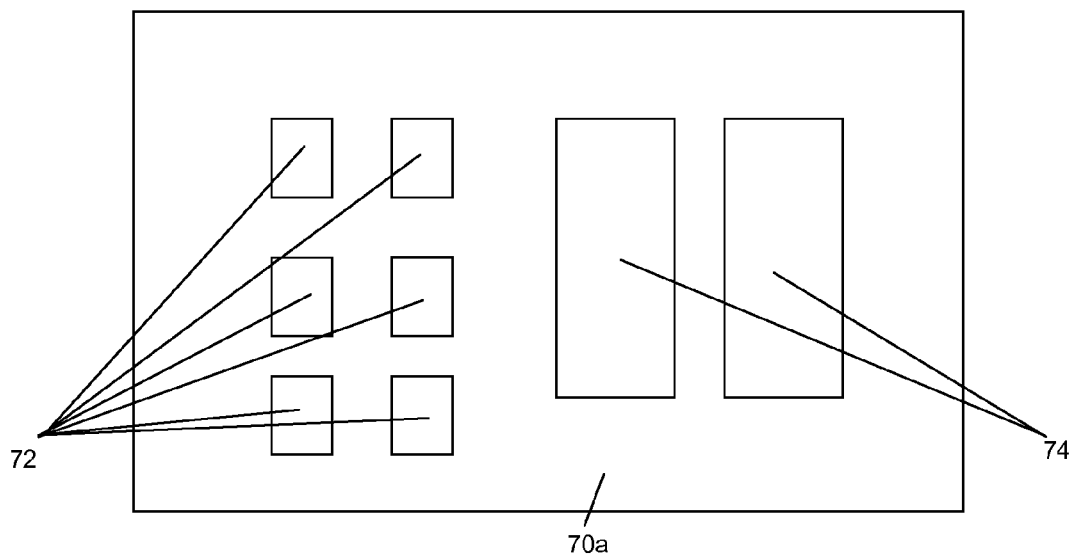
FIG. 2 shows timing electronics for use in the mass spectrometer shown in FIG. 1, that was used by the present inventors before the development of the present invention.

FIG. 2 shows timing electronics 70a for use in the mass spectrometer 1 shown in FIG. 1, that was used by the present inventors before the development of the present invention.

The timing electronics 70a shown in FIG. 2 uses high speed positive-emitter-coupled logic (PECL) integrated circuits 72 and counter electronics 74. Certain disadvantages associated with using PECL circuitry in timing electronics have already been discussed above.

A problem with using the timing electronics 70a shown in FIG. 2 to produce one or more control signals for controlling the operation of one or more components of a mass spectrometer, is that a trigger signal indicating the occurrence of a trigger event (e.g. the firing of a laser) is, in general, asynchronous with a clock of the timing electronics 70a. This meant that there is generally a jitter, often on the nanosecond time scale, between the trigger signal and the clock of the timing electronics 70a, which means that it is not possible for the timing electronics 70a to produce a control signal that is accurately synchronised to the trigger signal.

Figure 3:
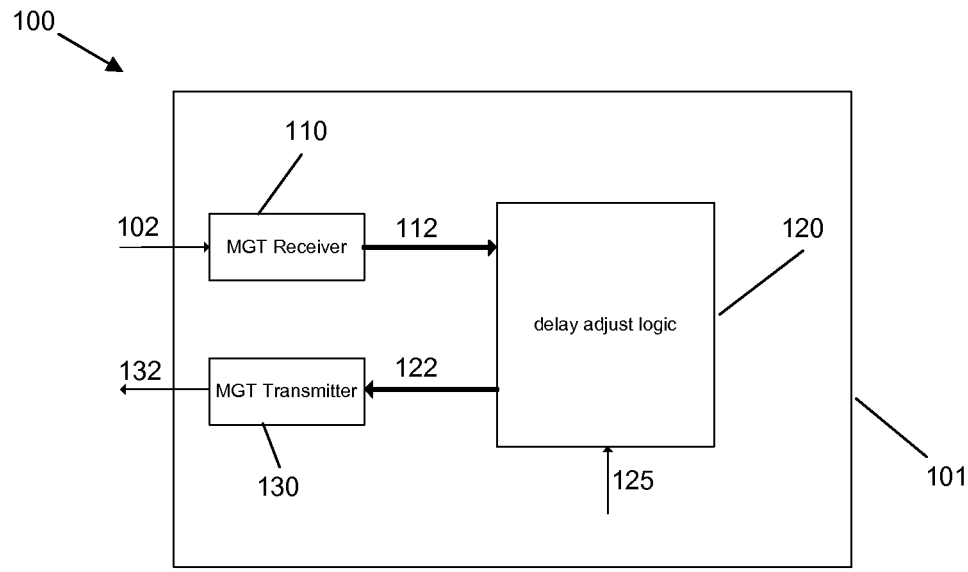
FIG. 3 shows a timing device for processing trigger signal data containing a trigger signal indicating the occurrence of a trigger event.

FIG. 3 shows a timing device 100 for processing trigger signal data containing a trigger signal indicating the occurrence of a trigger event.

The following description describes how the timing device 100 can be configured to produce one or more control signals for controlling the operation of one or more components of a mass spectrometer. However, as would be apparent to a skilled person, the timing device 100 may equally be used in other ways and in apparatuses other than mass spectrometers.

As shown in FIG. 3, the timing device 100 includes an FPGA 101 having a trigger signal deserialiser 110, in the form of an MGT receiver, configured to receive trigger signal data containing a trigger signal indicating the occurrence of a trigger event as serial data 102 and to output the trigger signal data as parallel data 112.

The trigger signal data received as serial data 102 by the trigger signal deserialiser 110 may have been outputted, for example, by the trigger signal data source including a photodiode and comparator, as described above with reference to FIG. 1. In connection with this, whilst FIG. 3 implies that the photodiode and the comparator of the trigger signal data source are external to the FPGA 101, in some embodiments, the comparator of the trigger signal data source may be mounted on the FPGA 101.

The timing device 100 also has a processing means 120 configured to process trigger signal data outputted by the trigger signal deserialiser 110 as parallel data 112.

For the timing device 100 shown in FIG. 3, the processing means 120 is "delay adjust" logic which is preferably configured to produce control data for controlling the operation of one or more components of a mass spectrometer (not shown) based on trigger signal data outputted by the trigger signal deserialiser 110 as parallel data 112. More preferably, the processing means 120 is configured to detect a trigger signal contained in trigger signal data outputted by the trigger signal deserialiser as parallel data 112, and to produce control data based on the detected trigger signal such that the control data is synchronised to a trigger event indicated by the detected trigger signal.

The processing means 120 preferably operates at the parallel clock rate of the trigger signal deserialiser 110, which is determined by a clock of the FPGA 101.

The processing means 120 of the timing device 100 shown in FIG. 3 is preferably configured to output the control data as parallel data 122, preferably at the parallel clock rate of the trigger signal deserialiser 110. Accordingly, the timing device 100 preferably has an output serialiser 130, in the form of an MGT transmitter, configured to receive control data outputted by the processing means as parallel data 122 and to output the control data as serial data 132, preferably at the serial clock rate of the trigger signal deserialiser 110.

With the trigger signal deserialiser 110 and the output serialiser 130 being clocked at the same clock rate, each bit of the trigger signal data received by the timing device 100 and each bit of the control data produced by the processing means 120, in effect, represents a time bin having a duration equal to one clock period at the serial clock rate of the trigger signal deserialiser 110. The processing means 120 is therefore able to accurately produce control data with a precision of one clock period at the serial clock rate of the trigger signal deserialiser 110, even though it operates at the parallel clock rate of the trigger signal deserialiser 110, which, in general, will only be a fraction (typically 1/N, where N is the bit width of the parallel data produced by the trigger signal deserialiser 110) of the serial clock rate.

In general terms, the timing device 100 of FIG. 3 works by translating the trigger signal data from a first, relatively fast, clock domain operating at the serial (or "MGT") clock rate of the trigger signal deserialiser 110 into a second, relatively slow, clock domain operating at the ("FPGA") clock rate of the FPGA 101. Because the processing of the trigger signal data takes place in the second, relatively slow, clock domain, processing of the trigger signal data in the first, relatively fast, clock domain is avoided (if indeed it were possible to process the trigger signal at such speeds in the first place). For example, using 10 GHz MGTs as the trigger signal deserialiser 110 and the output serialiser 130 would allow the trigger signal data to be processed, and the control data to be produced, with a timing precision of 100 ps. However, by using 64 bit wide parallel trigger signal data, the processing means 120 of the FPGA 101 could process the data at a much more achievable 156.25 MHz (1/64×10 GHz).

Figure 4A:
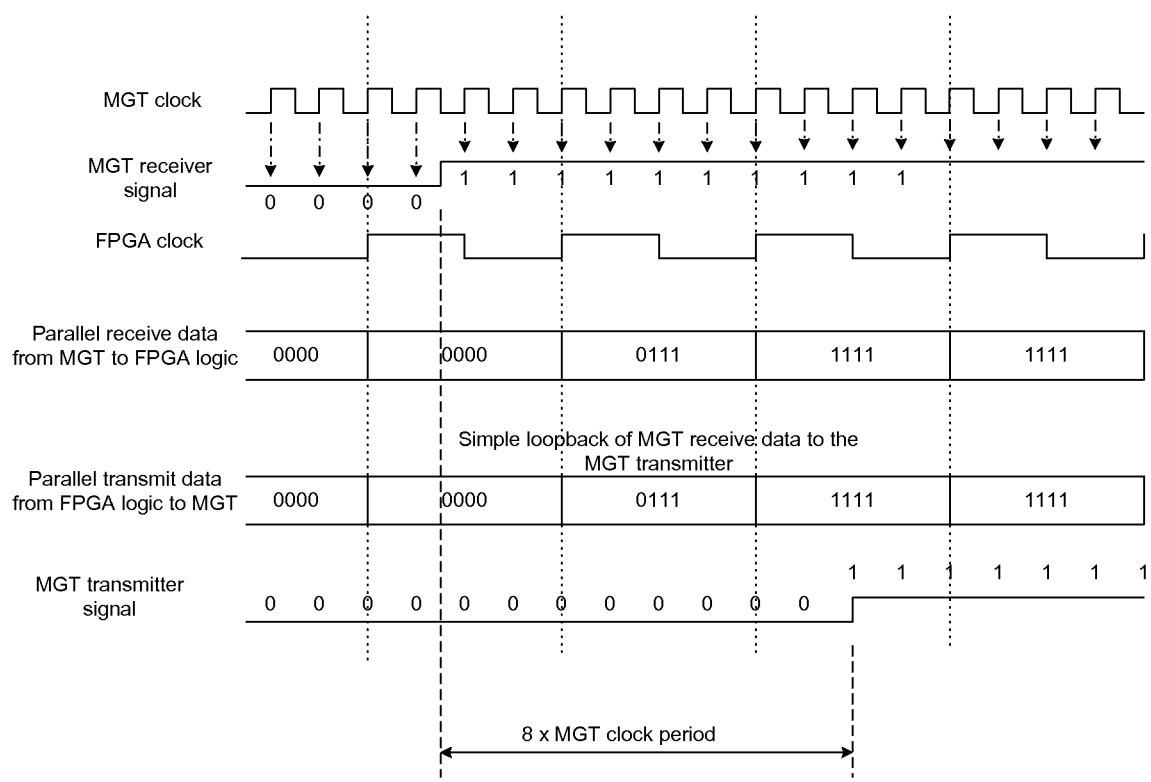
FIGS. 4a-c illustrate the operation of the timing device shown in FIG. 3 to produce different forms of control data.
Figure 4B:
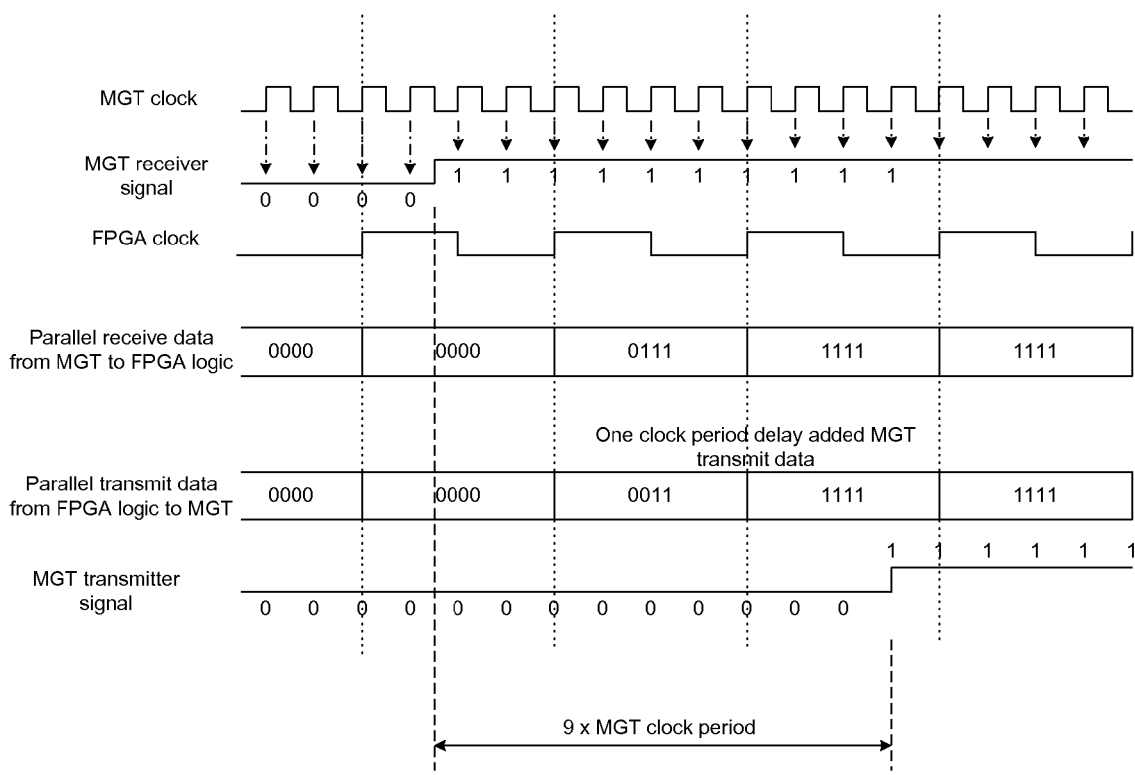
Figure 4C:
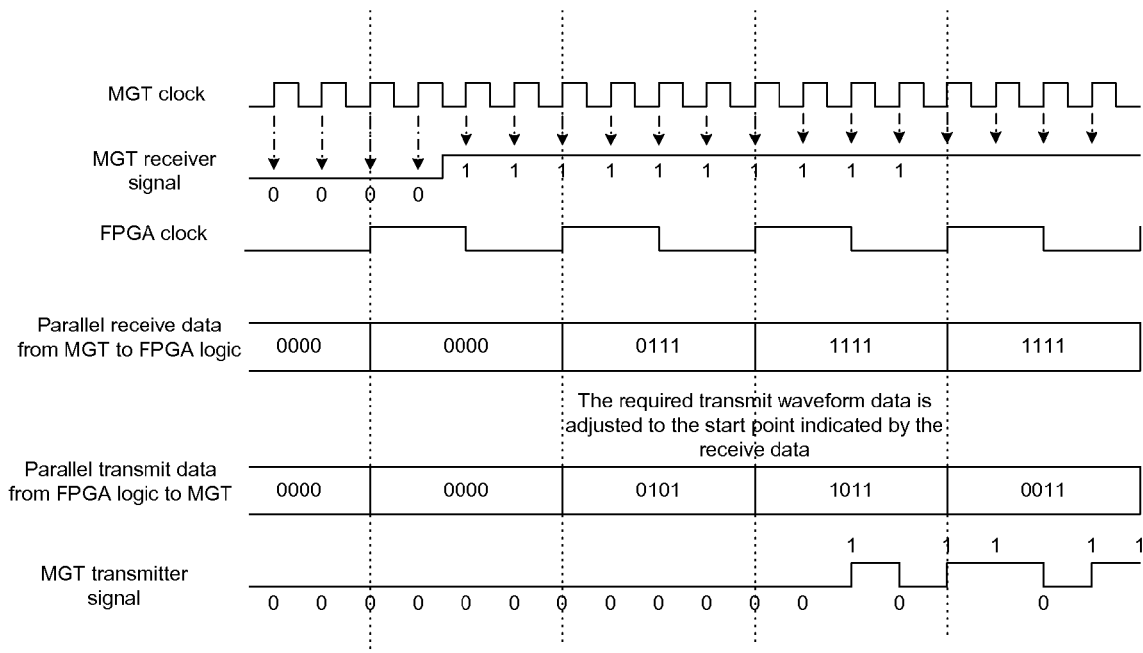

FIGS. 4a-c illustrate the operation of the timing device 100 shown in FIG. 3 to produce different forms of control data, in an example where the processing means 120 receives the trigger signal data outputted by the trigger signal deserialiser 110 as four bit wide parallel data including the sequence:
0000
0111
1111

Here, the trigger signal data 0000 indicates that a trigger signal has not yet been produced, 0111 contains a trigger signal indicating the firing of a laser for ionising sample material (i.e. the trigger event) in the form of a low to high transition (i.e. the transition from a 0 bit to a 1 bit), and 1111 indicates that a trigger signal has already been produced.

In FIG. 4a, the processing means 120 produces control data based on trigger signal data outputted by the trigger signal deserialiser as parallel data 112, by re-outputting the trigger signal data it receives from the trigger signal deserialiser 110 directly to the output serialiser 130. This represents the minimum latency delay of the timing device 100, which in this case is eight clock periods at the serial clock rate of the trigger signal deserialiser 110 or two clock periods at the parallel clock rate of the trigger signal deserialiser 110, as can be seen from FIG. 4a.

In FIG. 4b, the processing means 120 again produces control data based on trigger signal data outputted by the trigger signal deserialiser as parallel data 112, by re-outputting the trigger signal data it receives from the trigger signal deserialiser 110 to the output serialiser 130. However, unlike FIG. 4a, in FIG. 4b, the trigger signal data is not directly re-outputted by the processing means 120 to the output serialiser 130. Rather, in FIG. 4b, when the processing means 120 detects the trigger signal, the processing means 120 inserts a delay into the control data before it is outputted to the output serialiser 130, by inserting one or more extra 0 bits into the control data. Each 0 bit inserted into the control data by the processing means 120 provides an additional delay of one clock period at the serial clock rate of the trigger signal deserialiser 110 (in addition to the latency delay of the timing device 100). In this way, the processing means 120 can produce the control data with any required delay, with a precision of one clock period at the serial clock rate of the trigger signal deserialiser 110.

In the specific example shown in FIG. 4b, a delay of one clock period (one 0 bit) is inserted into the control data, such that the trigger signal data 0111 received by the processing means 120 becomes control data 0011. The control data outputted as serial data 132 produced according to FIG. 4a or 4b may be used to control, directly or indirectly (e.g. via a converting means), one or more components of a mass spectrometer, e.g. an extraction plate, an ion lens, an ion blanking gate and/or a gas valve.

In FIG. 4c, the processing means 120 produces control data based on trigger signal data outputted by the trigger signal deserialiser as parallel data 112, by outputting control data in the form of a digital waveform (i.e. a sequence of 0 and 1 bits), if it detects a trigger signal contained in trigger signal data outputted by the trigger signal deserialiser 110 as parallel data 112. In this way, it is possible for the processing means 120 to produce a digital waveform synchronised to the detected trigger signal, with a precision of one clock period at the serial clock rate of the trigger signal deserialiser 110.

In the specific example shown in FIG. 4c, the digital waveform produced by the processing means 120 is 0101 1011 0011, but any other waveform could be produced just as easily. As with the second mode of operation shown in FIG. 4b, it is possible for the processing means, if it detects a trigger signal, to insert a delay into the control data before it is outputted to the output serialiser 130, by inserting one or more extra 0 bits into the control data. The control data outputted as serial data 132 produced according to FIG. 4c or 4b may be used to control, directly or indirectly (e.g. via a converting means), one or more components of a mass spectrometer, e.g. an extraction plate, an ion lens, an ion blanking gate and/or a gas valve.

Although in FIGS. 4a-c, the trigger signal data outputted by the trigger signal deserialiser 110 is four bits wide, other bit widths are equally possible.

The processing means 120 could produce the control data, for example, based on fixed logic (e.g. within the processing means 120) or, as illustrated in FIG. 3, based on control signals 125 from an external microprocessor.

Preferably, the trigger signal deserialiser 110 and the output serialiser 130 are clocked by a common clock source, preferably at the serial clock rate of the trigger signal deserialiser 110, e.g. to reduce/prevent jitter between the trigger signal deserialiser 110 and the output serialiser 130.

Although the timing device 100 shown in FIG. 3 has only one output serialiser 130, in other embodiments, the timing device 100 may have multiple output serialisers, e.g. as in the timing device 300 described with reference to FIG. 9.

It is possible that a low to high (0 bit to 1 bit) transition may occur in the trigger signal data due to noise. The processing means 120 may therefore be configured to detect a trigger signal if it detects a succession of 0 bits before a low to high transition followed by a succession of is following the low to high transition, e.g. to reduce the risk of falsely detecting trigger signal, in other words, to achieve "noise immunity". Alternatively or additionally, a comparator of the trigger signal data source may be configured to implement hysteresis, e.g. so as to help reduce the possibility of a trigger signal being falsely outputted by the comparator due to noise on the output of the photodiode.

In some embodiments, the control data outputted by the output serialiser 130 as serial data 132 may control a component of a mass spectrometer directly. In other embodiments, the control data outputted by the output serialiser 130 as serial data 132 may control a component of the mass spectrometer indirectly, e.g. with the control data outputted by the output serialiser 130 as serial data 132 being converted into a control signal for controlling the component.

Figure 5A:
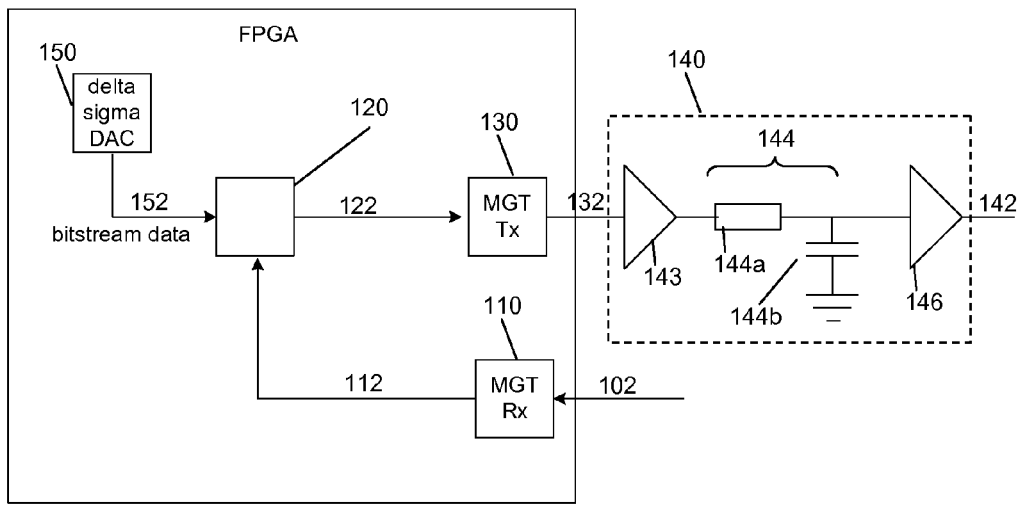
FIGS. 5a-c show different arrangements for using the timing device shown in FIG. 3 to produce a control signal for controlling a component of a mass spectrometer.
Figure 5B:
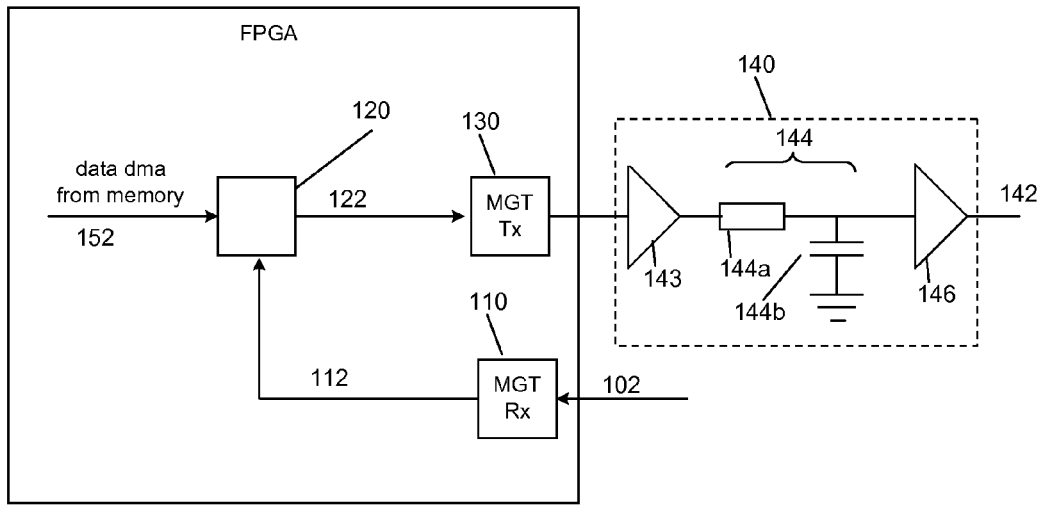
Figure 5C:
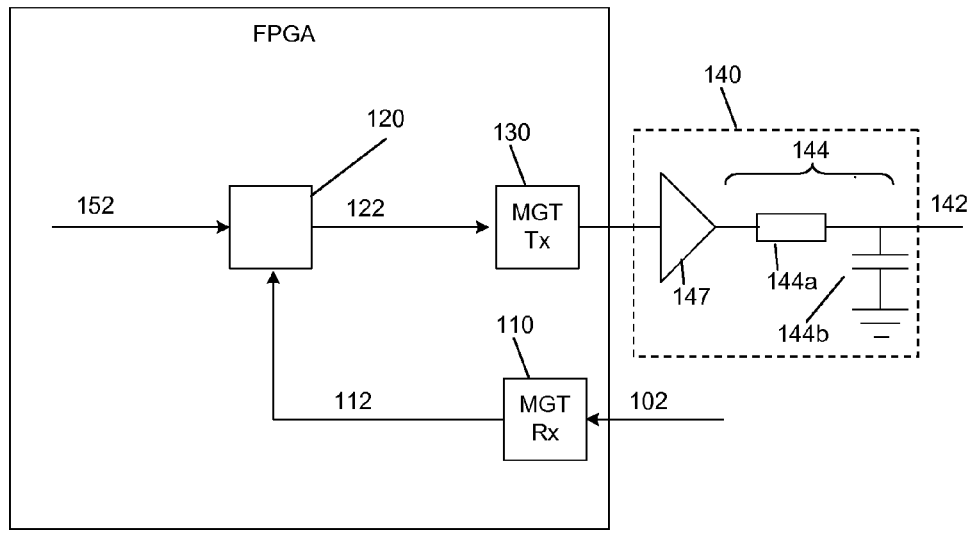

FIGS. 5a-c show different arrangements for using the timing device 100 shown in FIG. 3 to produce a control signal for controlling a component of a mass spectrometer.

FIGS. 5a and 5b show an arrangement including the timing device 100 and a converting means 140 for use in a mass spectrometer. The converting means 140 is configured to convert control data outputted by the output serialiser 130 as serial data 132, into a high voltage (e.g. ±500V or greater, ±1 kV or greater) analogue control signal for controlling a component of a mass spectrometer. The converting means 140 includes a buffer 143, a low pass filter 144 and an amplifier 146. The low pass filter 144 includes a resistor 144a and a capacitor 144b coupled to ground.

In use, the low pass filter converts the control data outputted by the output serialiser 130 as serial data into an analogue signal, as described in more detail below with reference to FIG. 6. The buffer 143 acts as a low impedance source which drives the low pass filter 144. The amplifier 146 amplifies the analogue signal outputted by the low pass filter 146 to produce a high voltage analogue signal. The resulting amplified analogue signal outputted by the converting means is a high voltage analogue control signal for controlling a component of a mass spectrometer.

Both FIGS. 5a and 5b show the processing means 120 of the timing device 100 as being provided with a digital waveform 152 to be outputted as control data by the processing means 120 if the processing means 120 detects a trigger signal. In FIG. 5a, the digital waveform 152 is supplied by a delta sigma DAC 150, which may produce the digital waveform 152 "on the fly". In FIG. 5b, the digital waveform 152 is pre-determined, having been pre-computed and then stored in a memory (not shown), which supplies the digital waveform 152 to the processing means 120.

In FIGS. 5a and 5b, the low pass filtering is performed in a low voltage domain, i.e. prior to amplification. However, as illustrated by FIG. 5c (which is otherwise the same as FIG. 5b), the low pass filtering may be performed in the high voltage domain, with a high voltage pulsing switch 147 being used to drive the low pass filter 144. The high voltage pulsing switch 147 may be configured to output a high voltage (e.g. ±500V or greater, ±1 kV or greater) when it receives a 1 bit and no voltage when it receives a 0 bit, for example.

Figure 6:
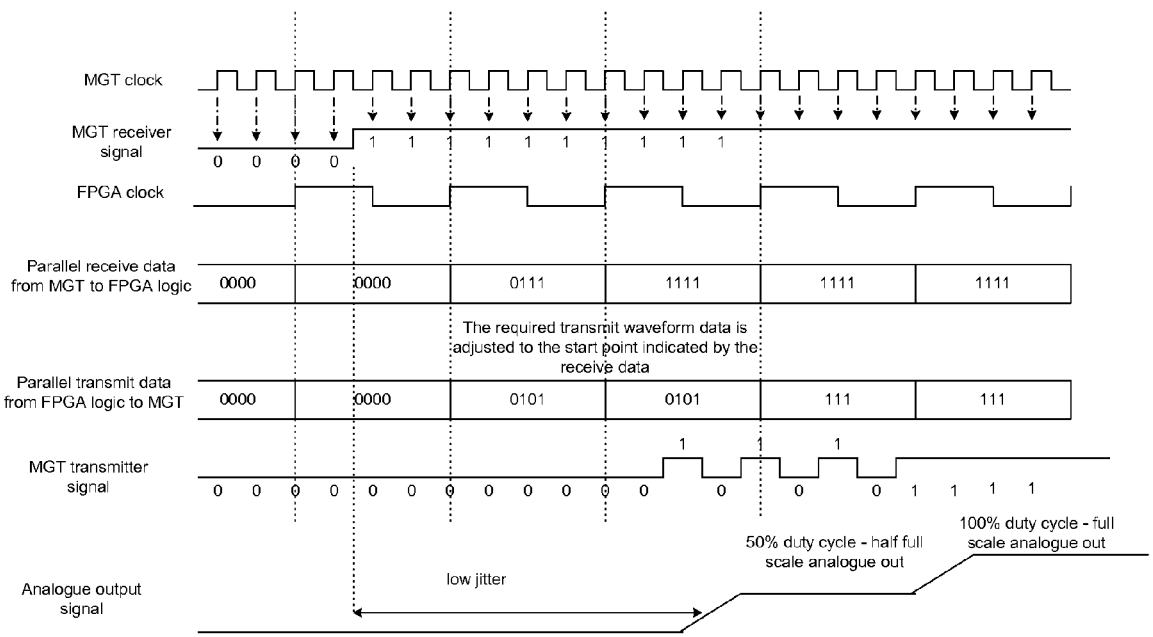
FIG. 6 illustrates the operation of the arrangements shown in FIG. 5a-c to produce an analogue control signal.

FIG. 6 illustrates the operation of the arrangements shown in FIGS. 5a-c to produce an analogue control signal.

As illustrated by FIG. 6, the processing means 120 outputs control data in the form of a digital waveform, if it detects a trigger signal contained in trigger signal data outputted by the trigger signal deserialiser 110 as parallel data 112. The pre-determined digital waveform is then outputted by the output serialiser 130 as serial data 132. This is similar to the operation of the processing means 120 described above with reference to FIG. 4c.

As illustrated by FIG. 6, the digital waveform outputted by the output serialiser 130 as serial data 132 is converted by the converting means 140 into a high voltage analogue control signal. The conversion from a digital waveform to an analogue waveform is performed by the low pass filter 144, which converts a sequence of 0 bits into a minimum analogue voltage, converts a sequence of 1 bits into a maximum analogue voltage, and converts a sequence of alternating 0s and 1s into an analogue voltage of 50% between the minimum and maximum analogue voltages by removing the high frequency switching component of the digital waveform. It may be possible to produce other analogue voltages using control data having a different digital waveform.

The analogue control signals can be produced with any required delay, by inserting extra 0 bits into the control data produced by the processing means, as has already been described with reference to FIGS. 4b and 4c.

Although FIGS. 5a-5c illustrate arrangements in which the converting means converts the control data into a high voltage analogue control signal, the converting means could easily be configured to convert the control data into a high voltage digital control signal by omitting the low pass filter 144 in any of these arrangements. Where the converting means is configured to convert the control data into a high voltage digital control signal, each 0 bit in the control data could, for example, result in the high voltage digital control signal being 0 Volts and each 1 bit in the control data could result in the high voltage digital control signal being a high voltage (e.g. ±500V or greater, ±1 kV or greater).

Although FIGS. 5a-c illustrate arrangements in which the converting means converts the control data produced by one output serialiser 130 into one control signal, it would be possible for multiple control signals to be produced by using multiple output serialisers and a converting means including a respective buffer, low pass filter, amplifier and/or high voltage pulsing switch for each output serialiser.

Note that the converting means 140 in the arrangements shown in FIGS. 5a-c is configured such that if the control data outputted by the output serialiser 130 as serial data 132 is synchronised to a trigger event indicated by a detected trigger signal, then the resulting control signal 142 is be synchronised to the trigger event.

The control signal 142 produced by the arrangements shown in any of FIGS. 5a-c may be used to control a component of a mass spectrometer, e.g. an extraction plate and/or an ion lens.

The timing electronics 70a shown in FIG. 2 can be used to adjust data produced by the analogue to digital converter of a mass spectrometer such that the adjusted data is synchronised to a trigger signal indicating the occurrence of a trigger event, e.g. the firing of a laser. Such synchronisation was, in the past, usually achieved by resetting the analogue to digital converter system, or using gating clock techniques, if a trigger signal was detected. However, both of these methodologies presented problems, because the logic required to achieve synchronisation according to these methodologies had to operate at the clock rate of the data outputted by the analogue to digital converter, which was typically very fast. These problems were made even worse when multi-channel analogue to digital converter systems were implemented.

To address these problems, the data outputted by the analogue to digital converter can be multiplexed before it is received by the timing electronics, such that multiple samples of data outputted by the analogue to digital converter are clocked into an FPGA of the timing electronics on each clock edge of the FPGA, in order to reduce the speed requirement on the timing electronics. However, multiplexing the data produced by the analogue to digital converter in this way meant that the timing electronics was not able to determine which part of the data outputted by the analogue to digital converter aligned with a trigger signal.

Figure 7:
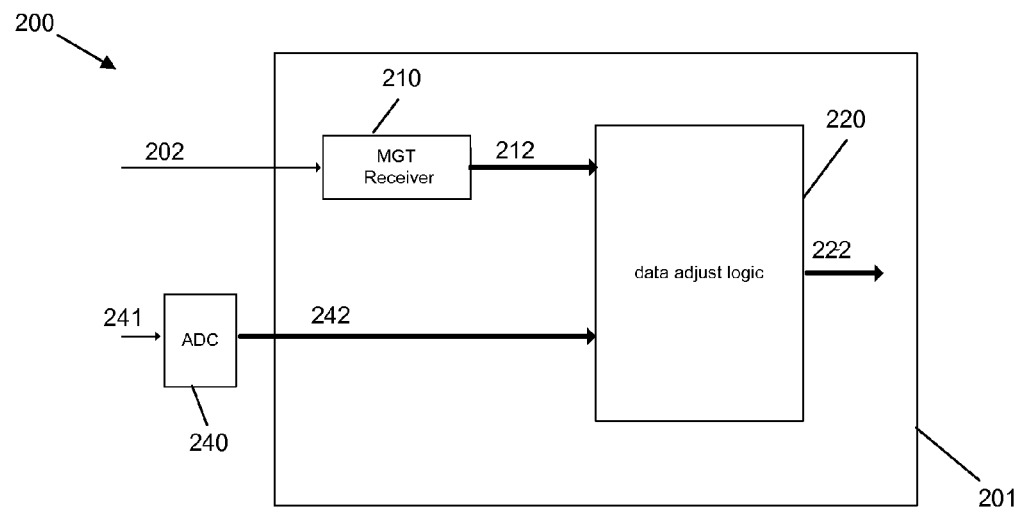
FIG. 7 shows another timing device for processing trigger signal data containing a trigger signal indicating the occurrence of a trigger event.

FIG. 7 shows another timing device 200 for processing trigger signal data containing a trigger signal indicating the occurrence of a trigger event.

The following description describes how the timing device 200 can be configured to adjust data produced by the analogue to digital converter of a mass spectrometer such that the adjusted data is synchronised to a trigger signal indicating the occurrence of a trigger event. However, as would be apparent to a skilled person, the timing device 100 may equally be used in other ways and in apparatuses other than mass spectrometers.

As shown in FIG. 7, the timing device 200 includes an FPGA 201 having a trigger signal deserialiser 210, in the form of an MGT receiver, configured to receive trigger signal data containing a trigger signal indicating the occurrence of a trigger event as serial data 202 and to output the trigger signal data as parallel data 212.

The trigger signal data received as serial data 202 by the trigger signal deserialiser 210 may have been outputted, for example, by the trigger signal data source including a photodiode and comparator, as described above with reference to FIG. 1.

The timing device 200 also has a processing means 220 configured to process trigger signal data outputted by the trigger signal deserialiser 210 as parallel data 212.

For the timing device 100 shown in FIG. 7, the processing means 220 is "data adjust" logic which is preferably configured to produce adjusted additional data by adjusting additional data received by the timing device, based on trigger signal data outputted by the trigger signal deserialiser 210 as parallel data 212. More preferably, the processing means 220 is configured to detect a trigger signal contained in trigger signal data outputted by the trigger signal deserialiser as parallel data 212, and to produce adjusted additional data by adjusting additional data received by the timing device based on the detected trigger signal such that the adjusted additional data is synchronised to a trigger event indicated by the detected trigger signal.

The processing means 220 preferably operates at the parallel clock rate of the trigger signal deserialiser 210, which is determined by a clock of the FPGA 201.

The processing means 220 of the timing device 200 shown in FIG. 7 is preferably configured to output the adjusted additional data as parallel data 222, preferably at the parallel clock rate of the trigger signal deserialiser 210.

As illustrated by FIG. 7, the additional data received by the timing device 200 is data outputted by an additional data source, which in this case includes an analogue to digital converter (ADC) 240 of a mass spectrometer which is preferably configured to output the additional data as parallel data 242, preferably at the parallel clock rate of the trigger signal deserialiser 210.

Preferably, the ADC 240 is configured to output the additional data based on an (e.g. analogue) output of an ion detector of the mass spectrometer (not shown). For example, the additional data produced by the ADC 240 may include a plurality of samples, each sample being a digital value representative of an analogue voltage produced by the ion detector at a respective sample point. The digital values are preferably multiplexed by the ADC 240, so that the additional data is outputted by the ADC 240 as parallel data 242. For example, the ADC 240 may output the additional data with four samples being outputted in parallel, e.g. as described below with reference to FIG. 8.

Preferably, the ADC 240 is configured to output the additional data such that one sample of the additional data is outputted per bit of the trigger signal data, as this helps to simplify the synchronisation of the additional data to a trigger signal detected by the processing means.

Preferably, the trigger signal deserialiser 210 and the ADC 240 are configured to be clocked by a common clock source, preferably at the serial clock rate of the trigger signal deserialiser, e.g. to reduce/prevent jitter between the trigger signal deserialiser 210 and the ADC 240.

Although FIG. 7 shows the ADC 240 as producing the additional data as parallel data 242, in other embodiments (not illustrated), the ADC 240 may produce serial data, in which case the timing device may have an additional data deserialiser (not illustrated) configured to receive additional data received by the timing device as serial data and to output the additional data as parallel data, preferably at the parallel clock rate of the trigger signal deserialiser 210.

Figure 8:
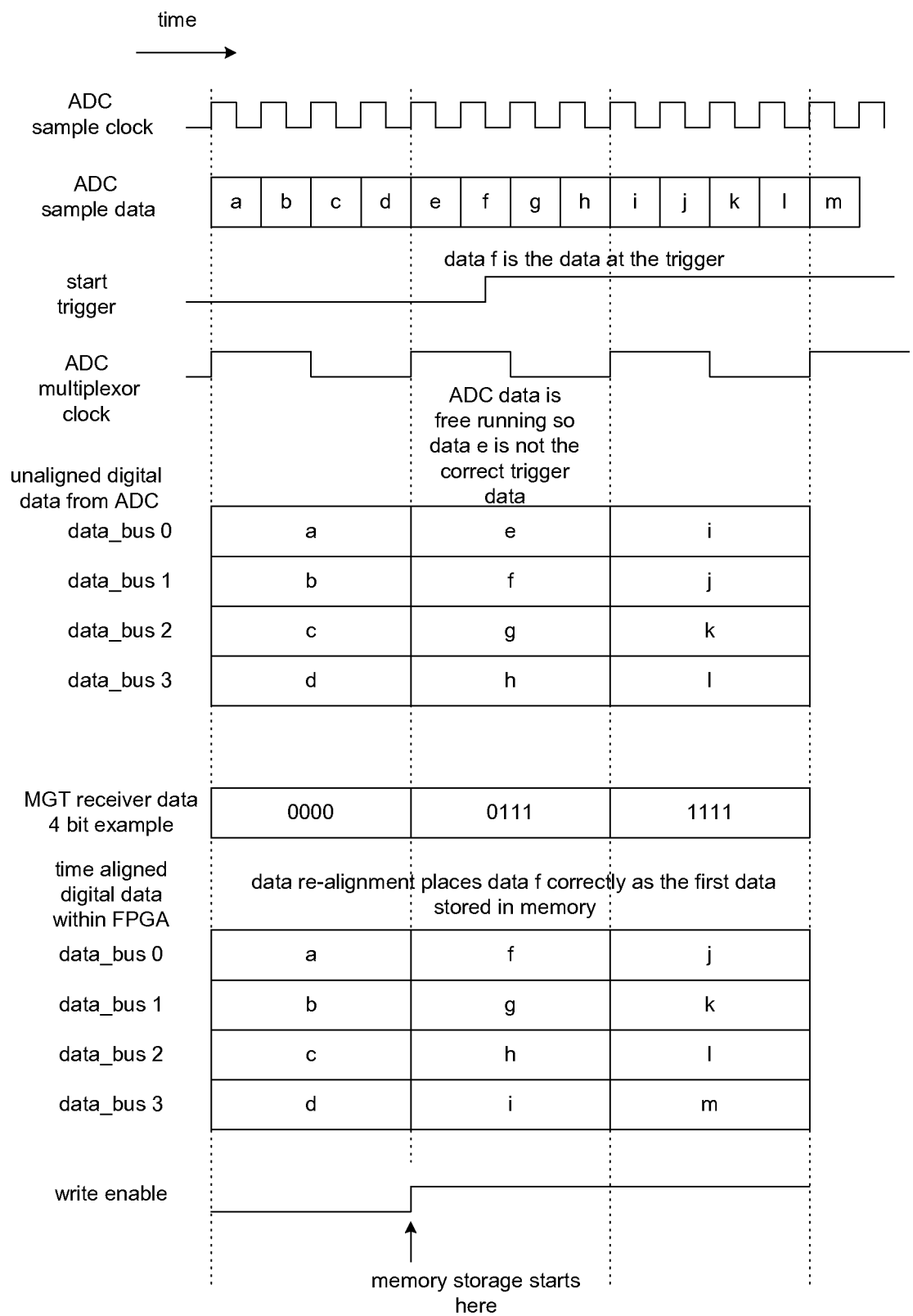
FIG. 8 illustrates the operation of the timing device shown in FIG. 7.

FIG. 8 illustrates the operation of the timing device 200 shown in FIG. 7, in an example where the ADC 240 outputs additional data as parallel data with four samples of additional data being outputted by the ADC 240 at the parallel clock rate of the trigger signal deserialiser and where the trigger signal deserialiser outputs trigger signal data as four bit wide parallel data at the parallel clock rate (thus, the ADC 240 outputs one sample of additional data per bit of the trigger signal data).

As illustrated in FIG. 8, the trigger signal contained in trigger signal data received by the trigger signal deserialiser 210 as serial data 212 coincides with a sample 'f' of the additional data outputted by the ADC 240 as parallel data 242. However, the additional data outputted by the ADC 240 as parallel data 242 happens to have sample 'e' on data_bus byte lane 0 of the ADC 240 (the trigger signal may of course coincide with a sample outputted by the ADC 240 on any of the data_bus byte lanes). However, because of the deserialisation carried out by the trigger signal deserialiser 210, the processing means 220 is able to detect the trigger signal and accurately determine which data_bus byte lane of the ADC 240 coincided with the detected trigger signal, and can therefore produce adjusted additional data that is synchronised to the detected trigger signal.

In the specific example illustrated in FIG. 8, the processing means produces adjusted additional data that is synchronised to the detected trigger signal by discarding sample 'e' from the additional data it receives from the ADC 240 as parallel data 242, such that sample 'f' is realigned onto data_bus_0, so that this sample is correctly the first sample stored in memory.

In general terms, by clocking an additional data source (which in this example was an external ADC 240) and a trigger signal deserialiser from the same clock source, the processing means is able to synchronise (time align) additional data outputted by the additional data source, based on the trigger signal data outputted by the trigger signal deserialiser as parallel data.

These principles could be applied to multiple additional data sources, e.g. so that respective additional data produced by each of multiple additional data sources could be synchronised to the same trigger signal(s).

The present inventors have observed that MGTs are designed for communication applications where typically the number of consecutive 1 bits and 0 bits in the transmitted/received serial data are limited. Large numbers of consecutive 1 bits or 0 bits can cause baseline wander of the input circuit in an MGT receiver resulting in timing inaccuracies. Also extended idle periods of the input line can cause problems with the clock recovery circuit or protocol support circuits in the MGT receiver which can cause realignment of the MGT receiver. To be used as a trigger signal deserialiser, an MGT receiver is preferably configured to function correctly with large numbers of consecutive 0 bits or 1 bits.

Figure 9:
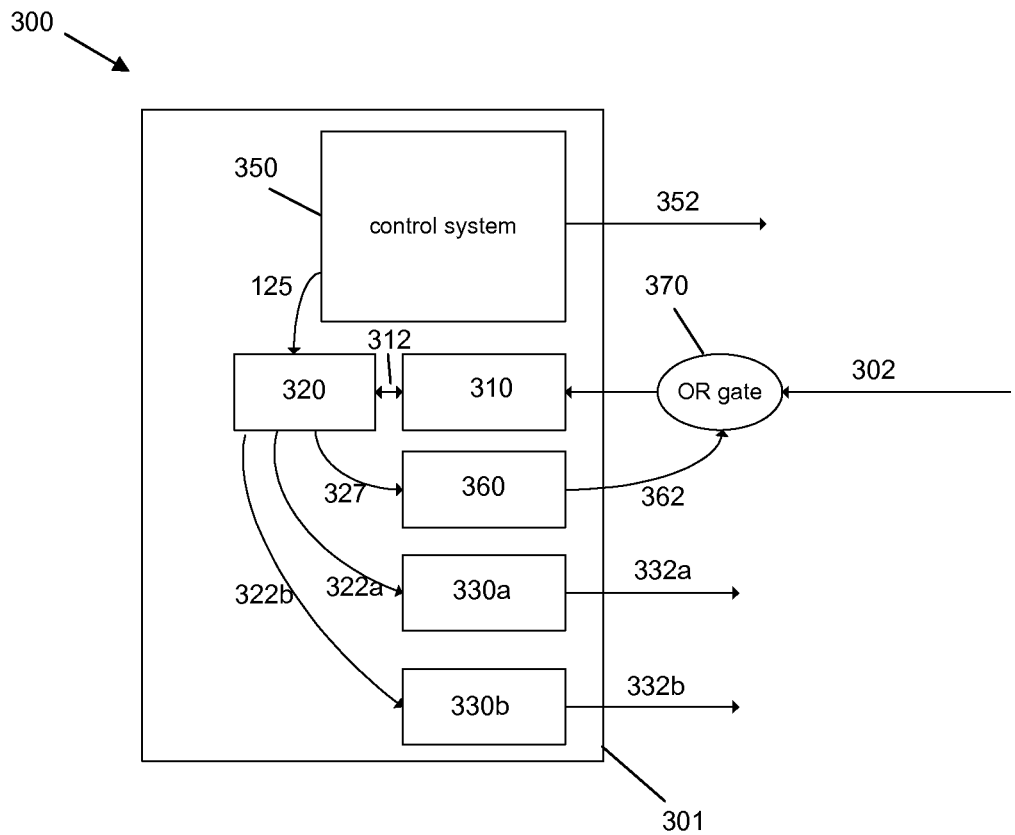
FIG. 9 shows yet another timing device for processing trigger signal data containing a trigger signal indicating the occurrence of a trigger event.

FIG. 9 shows yet another timing device 300 for processing trigger signal data containing a trigger signal indicating the occurrence of a trigger event, preferably for use in a mass spectrometer.

As shown in FIG. 9, the timing device 300 is similar to the timing device 100 shown in FIG. 3 and described above. Features of the timing device 300 shown in FIG. 9 which correspond to those of the timing device 100 shown in FIG. 3 have therefore been given corresponding reference numerals and need not be described in further detail.

In contrast to the timing device 100 shown in FIG. 3, the timing device 300 shown in FIG. 9 has multiple output serialisers 330a, 330b, in the form of multiple MGT transmitters, wherein each output serialiser 330a, 330b is configured to receive respective control data outputted by the processing means as parallel data 322a, 322b and to output the respective control data as serial data 332a, 332b preferably at the serial clock rate of the trigger signal deserialiser.

By selecting an appropriate number of output serialisers, this arrangement allows control data for controlling the operation of any number of components to be outputted as serial data 332a, 332b by the device. Preferably, the trigger signal deserialiser 310 and the multiple output serialisers 330a, 330b are configured to be clocked by a common clock source. Preferably the processing means 320 is configured to detect a trigger signal contained in trigger signal data outputted by the trigger signal deserialiser as parallel data 312, and to produce control data such that the (respective) control data outputted by each output serialiser 330a, 330b is synchronised to the same detected trigger signal.

The timing device 300 shown in FIG. 9 also has a control system 350 preferably configured controlling the processing means 320 ("control logic") and preferably configured to control other elements of a mass spectrometer via a system arm 352.

Circuits including MGT receivers typically require external and/or internal dc blocking capacitors which, in combination with line termination resistors, act as high pass filters. The present inventors have observed that inputting trigger signal data having long sequences of 0 bits followed by long sequences of 1 bits into such a circuit, can cause a charge to accumulate on the blocking capacitors. This has the effect of shifting the threshold point in the MGT receiver which in turn has the effect of jittering the trigger point of the MGT receiver.

Figure 10:
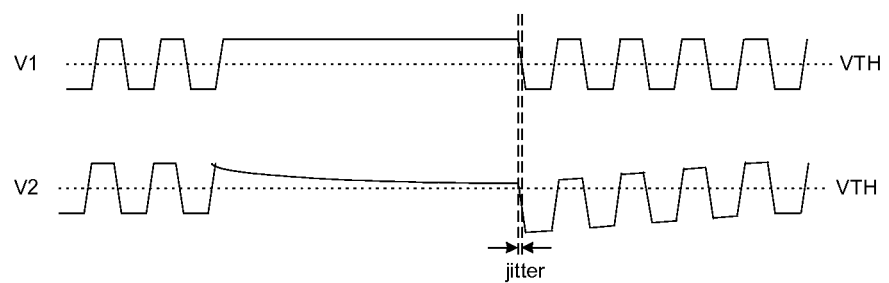
FIG. 10 illustrates the jitter that can be caused by trigger signal data containing a long sequence of 0 bits or 1 bits in a circuit including an MGT receiver and blocking capacitors.

FIG. 10 illustrates the jitter that can be caused by trigger signal data containing a long sequence of 0 bits or 1 bits in a circuit including an MGT receiver and blocking capacitors.

The top waveform in FIG. 10 represents an "ideal" situation in which the circuit does not include blocking capacitors. The lower waveform in FIG. 10 represents a "real" situation in which the circuit includes blocking capacitors. The long sequence of 1 bits shows the jitter produced by the use of blocking capacitors.

To address this issue, the timing device 300 shown in FIG. 9 has a pre-trigger signal data source 360, including a serialiser in the form of a further MGT transmitter, preferably configured to operate based on control signals 327 from the processing means 320.

The third timing device has an "OR" gate 370 via which the trigger signal data and the pre-trigger signal data are received by the trigger signal deserialiser.

The serialiser of the pre-trigger signal data source 360 is configured to output pre-trigger signal data, preferably containing a plurality of transitions between 0 and 1 bits (e.g. 10101010), as serial data 362 to be received by the trigger signal deserialiser 310 before the timing device 300 receives trigger signal data containing a trigger signal. In this way, time alignment errors caused by the above described dc drift can be minimised.

For best effect, the pre-trigger signal data source is preferably configured to output the pre-trigger signal data as close as possible to the trigger event indicated by the trigger signal, preferably with a gap of no more than 100 microseconds, more preferably no more than 10 microseconds, more preferably no more than 1 microsecond between the pre-trigger signal and the trigger event. Such a small gap may be achieved by suitable configuring of the control system 350, which may control both the trigger event (e.g. the firing of a laser for ionising sample material) and the pre-trigger signal data source.

The pre-trigger signal may take the form of an alternating 10101010 pattern for a duration of several hundred nanoseconds. Such a waveform may have an adequately high frequency content to restore the dc offset. However, the pre-trigger signal may equally take other forms.

When used in this specification and claims, the terms "comprises" and "comprising" and variations thereof mean that the specified features, steps or integers are included. The terms are not to be interpreted to exclude the presence of other features, steps or integers.

The features disclosed in the foregoing description, or in the following claims, or in the accompanying drawings, expressed in their specific forms or in terms of a means for performing the disclosed function, or a method or process for obtaining the disclosed results, as appropriate, may, separately, or in any combination of such features, be utilised for realising the invention in diverse forms thereof.

While the invention has been described in conjunction with the exemplary embodiments described above, many equivalent modifications and variations will be apparent to those skilled in the art when given this disclosure, without departing from the broad concepts disclosed. It is therefore intended that the scope of the patent granted hereon be limited only by the appended claims, as interpreted with reference to the description and drawings, and not by limitation of the embodiments described herein.

When an element is described as being "for" achieving an effect, the element may additionally be described as being "configured to" achieve that effect.

For example, whilst the devices described herein have been described in the context of mass spectrometers, the devices may be implemented in apparatuses other than mass spectrometers, e.g. other apparatuses where producing data which is synchronised to a trigger signal is important such as transient recorders, digital oscilloscopes, timer counters, pulse generators, pulse sequence generators, logic analysers and radio frequency digital to analogue converters (RF DACs).

The invention claimed is:

1. A timing device for processing trigger signal data containing a trigger signal indicating the occurrence of a trigger event, the timing device having:

a trigger signal deserialiser configured to receive trigger signal data containing a trigger signal indicating the occurrence of a trigger event as serial data and to output the trigger signal data as parallel data; and a processing means configured to process trigger signal data outputted by the trigger signal deserialiser as parallel data;

wherein the processing means is configured to detect a trigger signal contained in trigger signal data outputted by the trigger signal deserialiser as parallel data, and to produce control data for controlling the operation of one or more components based on the detected trigger signal such that the control data is synchronised to the trigger event indicated by the detected trigger signal;

wherein the processing means is configured to output the control data as parallel data, and the timing device has one or more output serialisers, wherein the or each output serialiser is configured to receive respective control data outputted by the processing means as parallel data and to output the respective control data as serial data.

2. A timing device according to claim 1, wherein the processing means is configured to insert a delay into the control data if the processing means detects a trigger signal.

3. A timing device according to claim 1, wherein the timing device is included in an apparatus having one or more components, wherein the processing means is configured to produce control data for controlling the operation of the one or more components.

4. A timing device according to claim 3 selected from the group consisting of:
   a) a timing device wherein the apparatus includes converting means configured to convert control data outputted by one or more output serialisers as serial data into one or more control signals for controlling the one or more components; and
   b) a timing device wherein the apparatus is a mass spectrometer, and the one or more components include one or more of: an extraction plate, an ion lens, an ion blanking gate and a gas valve.

5. A timing device according to claim 1, wherein the timing device is included in an apparatus having a trigger signal data source configured to output trigger signal data containing a trigger signal indicating the occurrence of a trigger event as serial data, wherein the trigger signal deserialiser of the timing device is configured to receive trigger signal data outputted by the trigger signal data source.

6. A timing device according to claim 5 selected from the group consisting of:
   a) a timing device wherein the trigger signal data source is configured to include a trigger signal in the trigger signal data to indicate the occurrence of a trigger event within the apparatus each time the trigger event occurs; and
   b) a timing device wherein the apparatus is a mass spectrometer, and the trigger signal data source includes a photodiode positioned to receive light fired by a laser for ionising sample material and a comparator configured to compare an output of the photodiode with a reference so that the comparator outputs a first voltage when the photodiode receives light fired by the laser and a second, different, voltage when the photodiode does not receive light fired by the laser.

7. A timing device according to claim 1, wherein the timing device has, or is connected to, a pre-trigger signal data source configured to output pre-trigger signal data as serial data to be received by the trigger signal deserialiser before the timing device receives trigger signal data containing a trigger signal.

8. A timing device according to claim 7 selected from the group consisting of:
   a) a timing device wherein the pre-trigger signal data source is configured to output pre-trigger signal data containing a plurality of transitions between 0 and 1 bits as serial data to be received by the trigger signal deserialiser before the timing device receives trigger signal data containing a trigger; and
   b) a timing device wherein the pre-trigger signal data source is configured to output the pre-trigger signal data with a gap of no more than 100 microseconds between the pre-trigger signal and the trigger event.

9. A timing device according to claim 1 selected from the group consisting of:
   a) a timing device wherein any aforementioned deserialiser and/or serialiser is a multi-gigabit transceiver or gigabit transceiver block; and
   b) a timing device wherein the timing device has a field programmable gate array, and the trigger signal deserialiser is included in the field programmable gate array.

10. A timing device for processing trigger signal data containing a trigger signal indicating the occurrence of a trigger event, the timing device having:
    a trigger signal deserialiser configured to receive trigger signal data containing a trigger signal indicating the occurrence of a trigger event as serial data and to output the trigger signal data as parallel data;
    a processing means configured to process trigger signal data outputted by the trigger signal deserialiser as parallel data;
    wherein the processing means is configured to detect a trigger signal contained in the trigger signal data outputted by the trigger signal deserialiser as parallel data, and to produce adjusted additional data by adjusting additional data received by the timing device based on the detected trigger signal such that the adjusted additional data is synchronized to a trigger event indicated by the detected trigger signal.

11. A timing device according to claim 10, wherein the timing device is included in an apparatus having an additional data source configured to output additional data, wherein the timing device is configured to receive additional data outputted by the additional data source.

12. A timing device according to claim 11, wherein the additional data source includes an analogue to digital converter.

13. A timing device according to claim 12, wherein the apparatus is a mass spectrometer and the analogue to digital converter is configured to output the additional data based on an output of an ion detector of the mass spectrometer.

* * * * *